United States Patent
Li et al.

(10) Patent No.: US 7,390,109 B2
(45) Date of Patent: Jun. 24, 2008

(54) LIGHT-EMITTING DIODE COMPONENT HAVING A LIGHT DIRECTION-CHANGING UNIT AND RELATED LIGHT DIRECTION-CHANGING UNIT AND MODULE

(75) Inventors: Zhi-Feng Li, Taipei (TW); Yung-Fu Wu, Taipei (TW); Po-Hsien Lee, Taipei (TW)

(73) Assignee: Lite-On Technology Corp., Neihu, Taipei (TW)

( * ) Notice: Subject to any disclaimer, the term of this patent is extended or adjusted under 35 U.S.C. 154(b) by 127 days.

(21) Appl. No.: 11/162,466

(22) Filed: Sep. 12, 2005

(65) Prior Publication Data

US 2006/0262538 A1  Nov. 23, 2006

(30) Foreign Application Priority Data

May 18, 2005  (CN) .......................... 2005 1 0072958

(51) Int. Cl.
    *F21V 5/02* (2006.01)
(52) U.S. Cl. .................... 362/296; 362/800; 362/309; 362/327; 362/338; 362/311
(58) Field of Classification Search ................ 362/296, 362/800, 309, 327, 333, 335, 338, 545, 555, 362/311; 257/98, 99, 100; 313/512
See application file for complete search history.

(56) References Cited

U.S. PATENT DOCUMENTS

| | | | | |
|---|---|---|---|---|
| 3,746,853 | A * | 7/1973 | Kosman et al. | 362/301 |
| 4,638,343 | A * | 1/1987 | Althaus et al. | 257/98 |
| 5,642,933 | A * | 7/1997 | Hitora | 362/243 |
| 5,825,051 | A | 10/1998 | Bauer | |
| 6,404,131 | B1 * | 6/2002 | Kawano et al. | 315/82 |
| 6,674,096 | B2 * | 1/2004 | Sommers | 257/98 |
| 6,679,621 | B2 | 1/2004 | West | |
| 6,995,400 | B2 * | 2/2006 | Mizuyoshi | 257/79 |
| 2002/0185651 | A1 | 12/2002 | Sommers | |
| 2004/0212998 | A1 * | 10/2004 | Mohacsi | 362/294 |
| 2005/0063188 | A1 | 3/2005 | Wong | |

FOREIGN PATENT DOCUMENTS

TW            565951         12/2003

\* cited by examiner

*Primary Examiner*—Sharon E Payne
(74) *Attorney, Agent, or Firm*—Winston Hsu

(57) ABSTRACT

A light-emitting diode (LED) component includes a circuit board, an LED chip installed on the circuit board for emitting light, and a light direction-changing unit. The LED chip is composed of a plurality of light-emitting points. The unit has a covering surface covering the LED chip, and a reflecting surface having a plurality of reflecting points. A smallest included angle of a plurality of included angles between a normal line of at least one of the reflecting points and a plurality of connection lines passing through the reflecting point and the light-emitting points is larger than $\sin^{-1}(1/n)$, where n is the reflection index of the light direction-changing unit.

1 Claim, 9 Drawing Sheets

US 7,390,109 B2

LIGHT-EMITTING DIODE COMPONENT HAVING A LIGHT DIRECTION-CHANGING UNIT AND RELATED LIGHT DIRECTION-CHANGING UNIT AND MODULE

BACKGROUND OF THE INVENTION

1. Field of the Invention

The present invention relates to a light-emitting diode (LED), and more particularly, to an LED component having a light direction-changing unit and related light direction-changing unit and module.

2. Description of the Prior Art

Please refer to FIG. 1, which is a schematic diagram of an LED component 10 according to the prior art. The LED component 10 comprises a circuit board 12, an LED chip 14 installed on the circuit board 12, and gel material 16 covering the LED chip 14.

The LED chip 14 is installed for emitting light LLED, most of which travels toward a direction perpendicular to the circuit board 12.

The LED component 10 is applied to a variety of top-viewing electronic devices, such as liquid crystal displays (LCD), and lighting circuits, because most of the light LLED emitted by the LED component 10 travels toward a direction perpendicular to the circuit board 12.

However, that most of the light LLED emitted by the LED component 10 travels toward a direction perpendicular to the circuit board 12 makes the LED component 10 unable to be used in any side-viewing electronic devices, such as a keypad of a cellular phone. The backlight on the keypad requires that the LED component 10 emit light traveling not only toward a direction perpendicular to the circuit board 12, but also toward another direction in parallel to the circuit board 12.

SUMMARY OF THE INVENTION

It is therefore a primary objective of the claimed invention to provide an LED component having a light direction-changing unit and related light direction-changing unit and module to overcome the above-mentioned problems. The light direction-changing unit is capable of changing the direction of light emitted by an LED chip of the LED component, from a direction perpendicular to a circuit board to another direction in parallel to the circuit board.

The LED component includes a circuit board, an LED chip installed on the circuit board for emitting light, and a light direction-changing unit for changing direction of the light emitted by the LED chip. The LED chip includes a plurality of light-emitting points. The light direction-changing unit has a covering surface for covering the LED chip, and a reflecting surface composed of a plurality of reflecting points, a smallest included angle of a plurality of included angles between a normal line of at least one of the reflecting points and a plurality of connection lines passing through the reflecting point and the light-emitting points being larger than sin−1(1/n), where n is a reflection index of the light direction-changing unit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
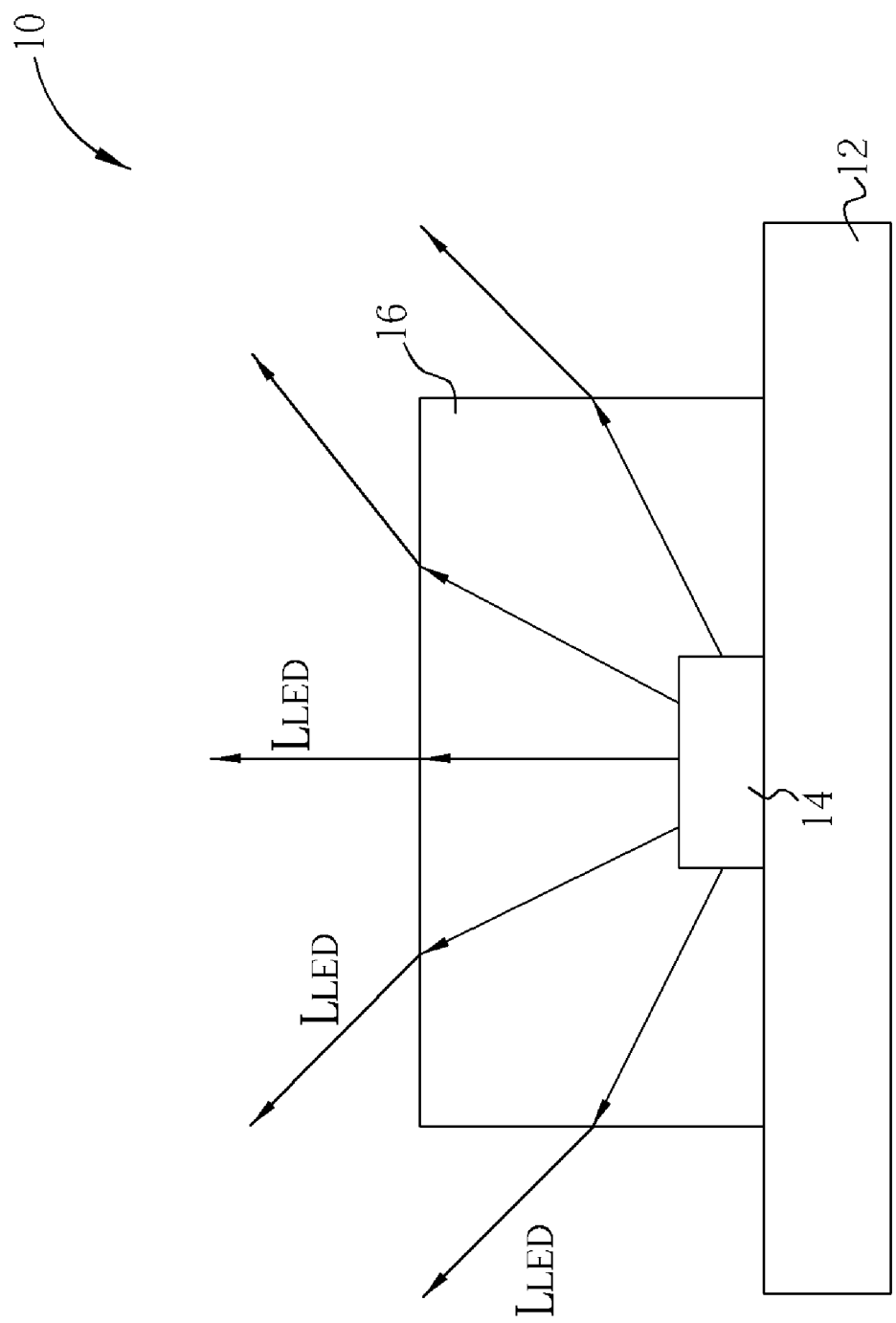
FIG. 1 is a schematic diagram of an LED component according to the prior art.
Figure 2:
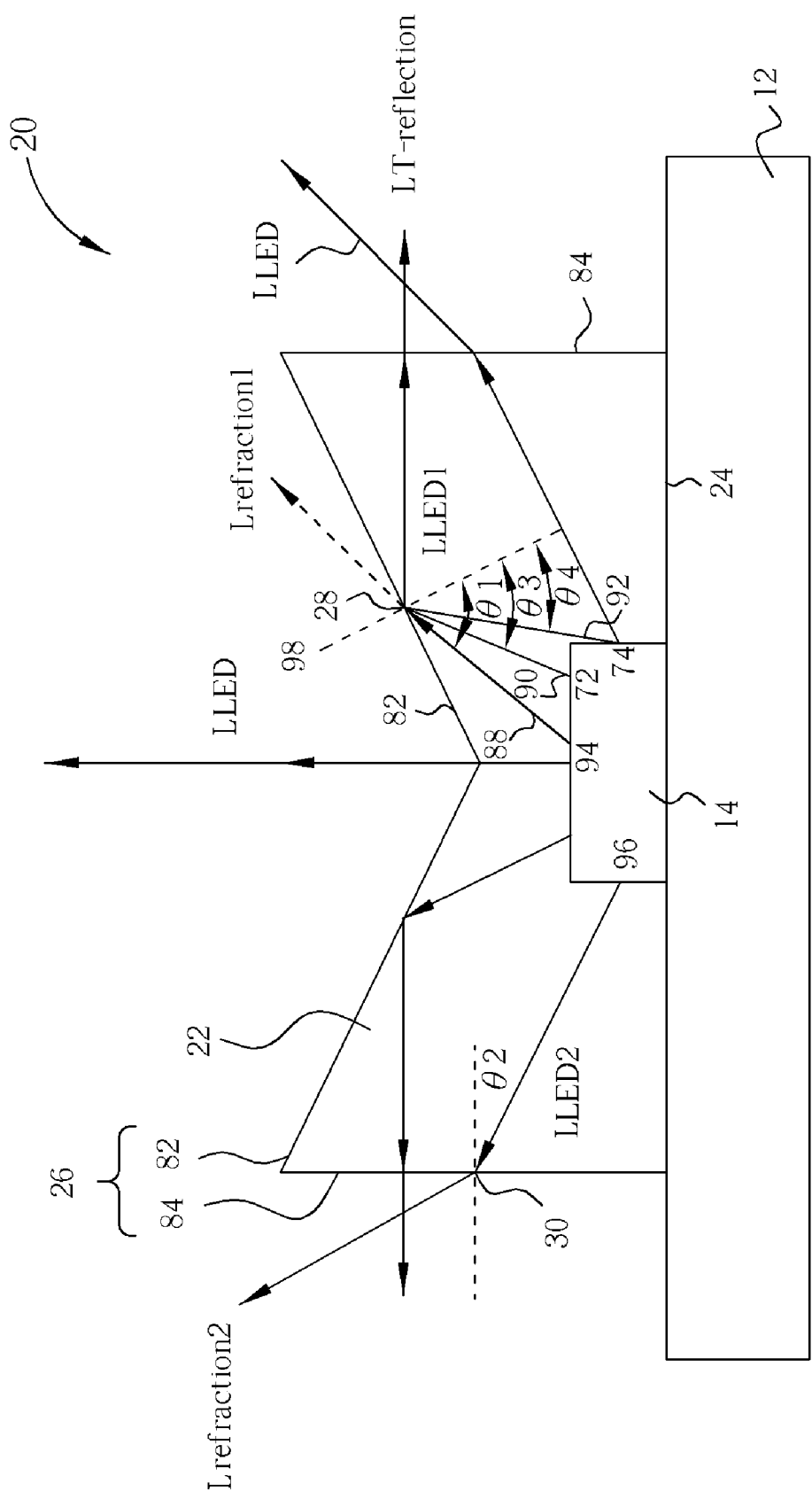
FIG. 2 is a schematic diagram of an LED component of the preferred embodiment according to the present invention.

Please refer to FIG. 2, which is a schematic diagram of an LED component 20 of the preferred embodiment according to the present invention. The LED component 20 comprises a circuit board 12, an LED chip 14, and a light direction-changing unit 22 covering the LED chip 14 for directing most of the light LLED emitted by the LED chip 14 to travel toward a direction in parallel to the circuit board 12. The LED chip 14 comprises a plurality of light-emitting points 72, 74, 94, 96, etc.

The light direction-changing unit 22 comprises a covering surface 24 covering the LED chip 14, and a reflecting surface 26 capable of reflecting the light LLED emitted by the LED chip 14, most of which travels toward a direction perpendicular to the circuit board 12, to travel toward another direction in parallel with the circuit board 12. The reflecting surface 26 comprises a top reflecting surface 82 and a side reflecting surface 84.

The reflecting surface 26 comprises a plurality of reflecting points (such as a first reflecting point 28 of the top reflecting surface 82, and a second reflecting point 30 of the reflecting surface 84). At least one of the reflecting points of the top reflecting surface 82, for example the first reflecting point 28, receives light LLED having an incident angle larger than sin−1(1/n) (a critical angle θC according to Snell's law), where n is an index of refraction of the light direction-changing unit 22. For example, since a first incident angle θ1 of first light LLED1 emitted by a light-emitting point 94 of the LED chip 14 and received by the first reflecting point 28 of the top reflecting surface 82 is larger than sin−1(1/n), the first light LLED1 will not be refracted to be first refraction light Lrefraction1, but will be totally reflected to be total reflection light LT-reflection. On the other hand, since a second incident angle θ2 of second light LLED2 emitted by a light-emitting point 96 of the LED chip 14 and received by a second reflecting point 30 of the side reflecting surface 84 is still smaller than sin−1(1/n), the second light LLED2 will be refracted to be second refraction light Lrefraction2. In summary, in the LED component 20 of the present invention, a smallest included angle (for example, θ4) of a plurality of included angles (for example θ1, θ3 and θ4) between a normal line 98 of at least one (for example the first reflecting point 28) of the reflecting points and a plurality of connection lines connecting the reflecting point and the light-emitting points (for example a line 88 connecting the first reflecting point 28 and the light-emitting point 94, a connection line 90 connecting the first reflecting point 28 and the light-emitting point 72, and a connection line 92 connecting the first reflecting point 28 and the light-emitting point 74) is larger than sin−1(1/n), where n is an index of refraction of the light direction-changing unit 22.

Figure 3:
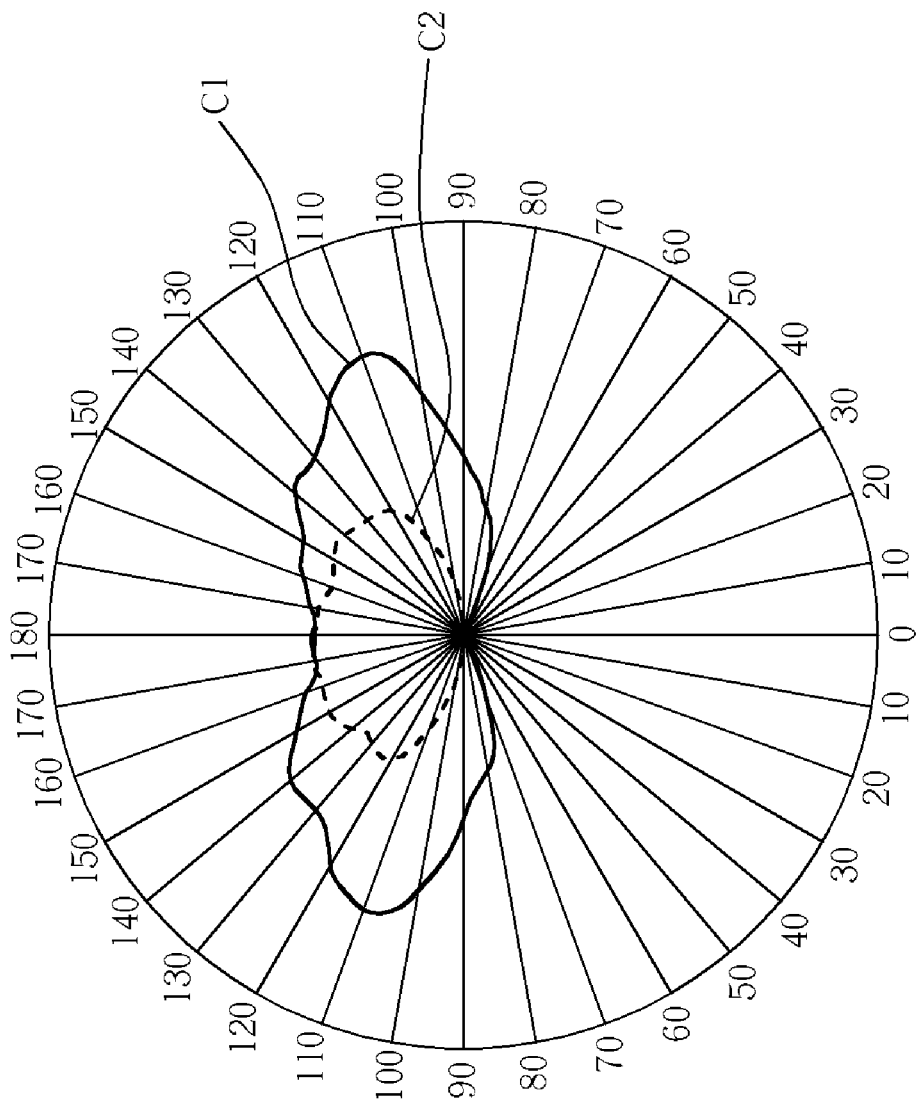
FIG. 3 is a light luminance spectrum of the LED component shown in FIG. 2.

Please refer to FIG. 3, which is a light luminance spectrum of the LED component 20, wherein a first curve C1 represents a 3600 luminance distribution of light LLED traveling toward a direction in parallel to the circuit board 22, and a second curve C2 represents a 3600 luminance distribution of light LLED traveling toward another direction perpendicular to the circuit board 22. It is apparent that, in the LED component 20, the light LLED traveling toward a direction in parallel to the circuit board 12 has a luminance value larger than that of the light LLED traveling toward another direction perpendicular to the circuit board 12. The LED component 20 can be applied to a side-viewing electronic device.

Of the preferred embodiment of the present invention, the light direction-changing unit 22 comprises epoxy resin.

In order to simplify the implementation of the light direction-changing unit 22, that is without implementing the top reflection surface 82 point by point according to a standard that the incident angles of light projected onto the reflection surface 82 are all larger than sin−(1/n), the top reflecting surface 82 of light direction-changing unit 22 of the LED component 20 can be in the shape of a simple geometric figure. For example, the top reflecting surface 82 can be a V-shaped planar reflecting surface, as shown in FIG. 4, or a V-shaped curved reflecting surface, as shown in FIG. 5.

Figure 4:
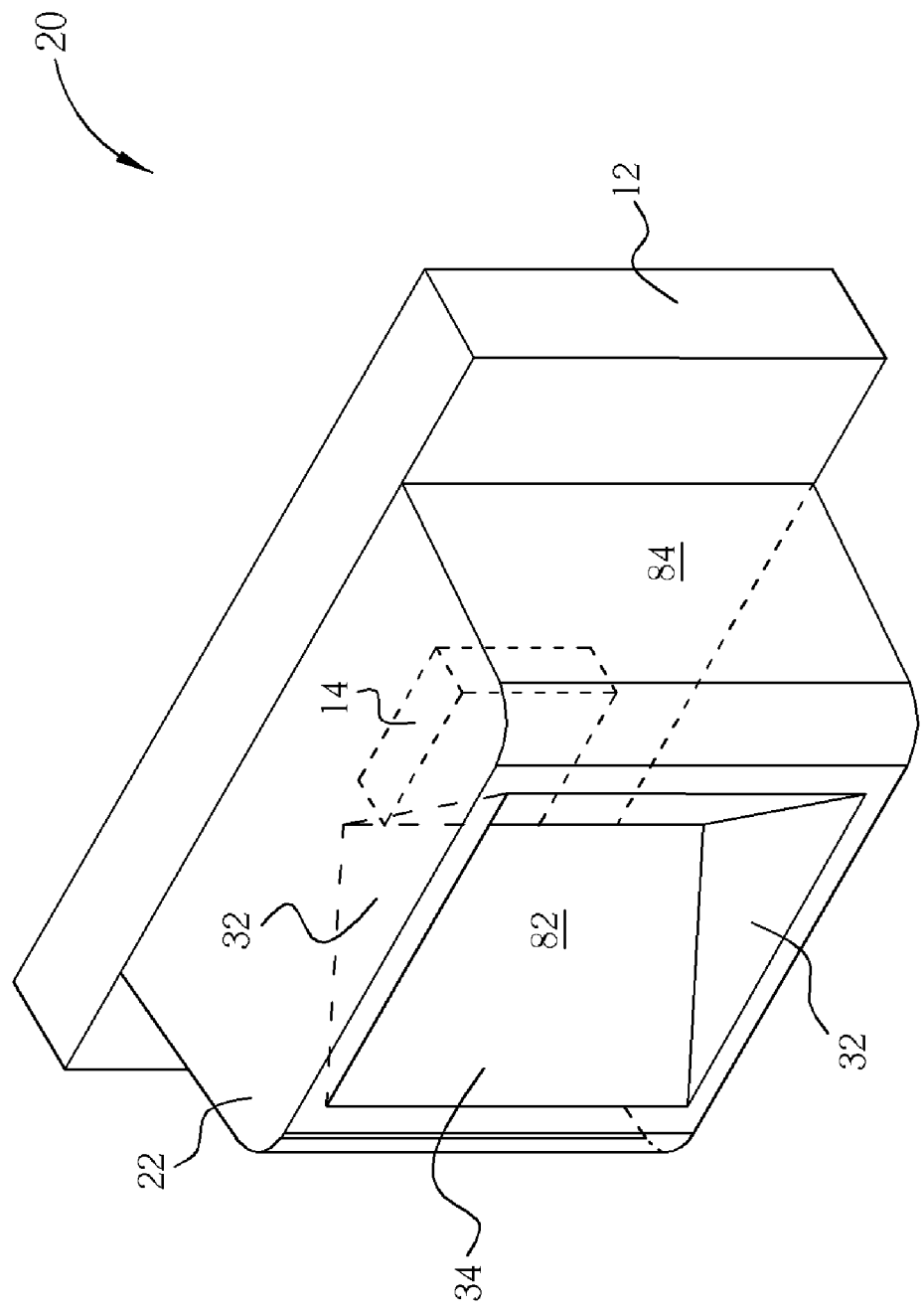
FIG. 4 is a schematic diagram of an LED component of a second embodiment according to the present invention.
Figure 5:
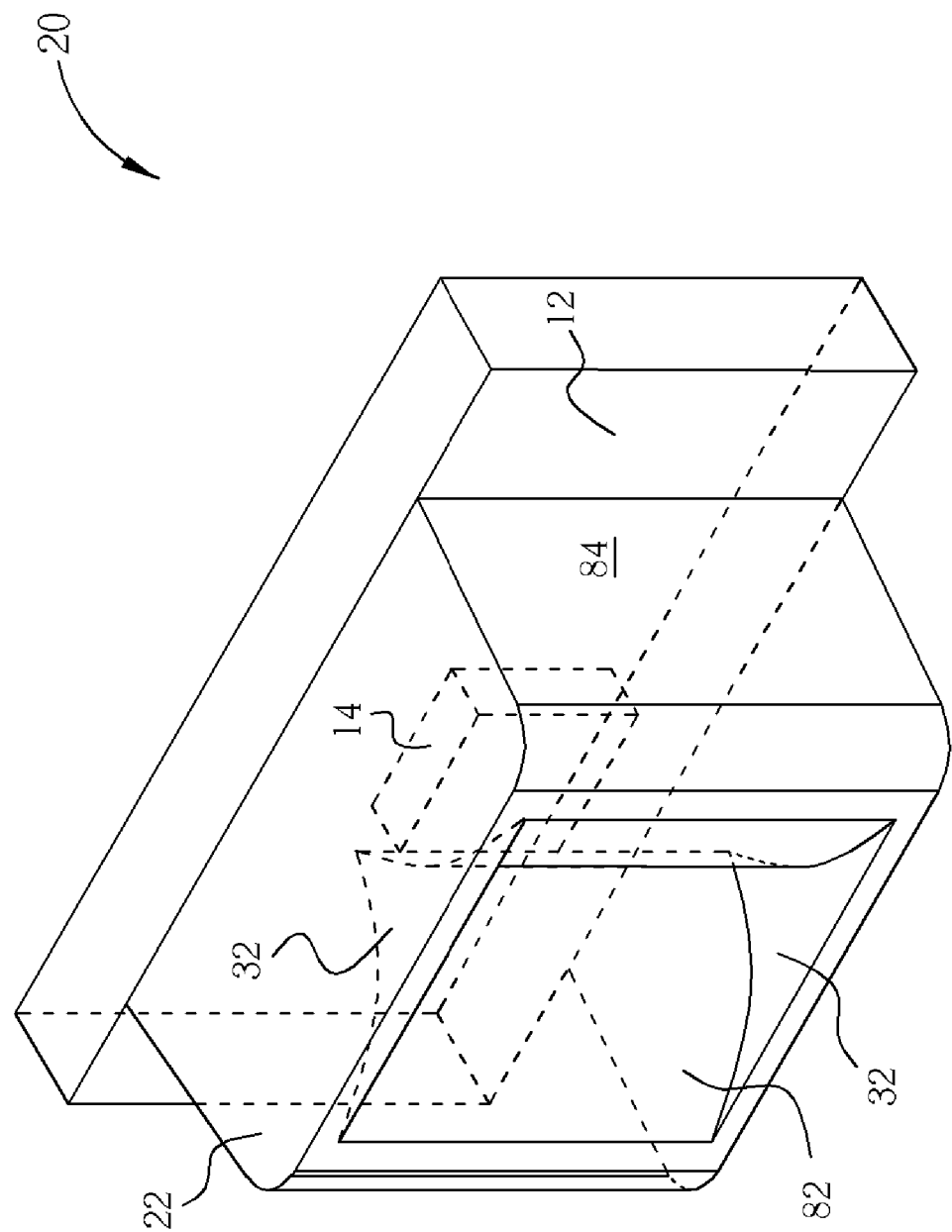
FIG. 5 is a schematic diagram of an LED component of a third embodiment according to the present invention.

Of the light direction-changing unit 22 shown in FIG. 4 and FIG. 5, the top reflecting surface 82 comprises a pair of upright surfaces 32 installed on two sides of top reflecting surface 82, the V-shaped planar (or curved) top reflecting surface 82 alone forming a V-shaped planar (or curved) trough, and, together with the upright surfaces, forming a V-shaped planar (or curved) indentation.

Figure 6:
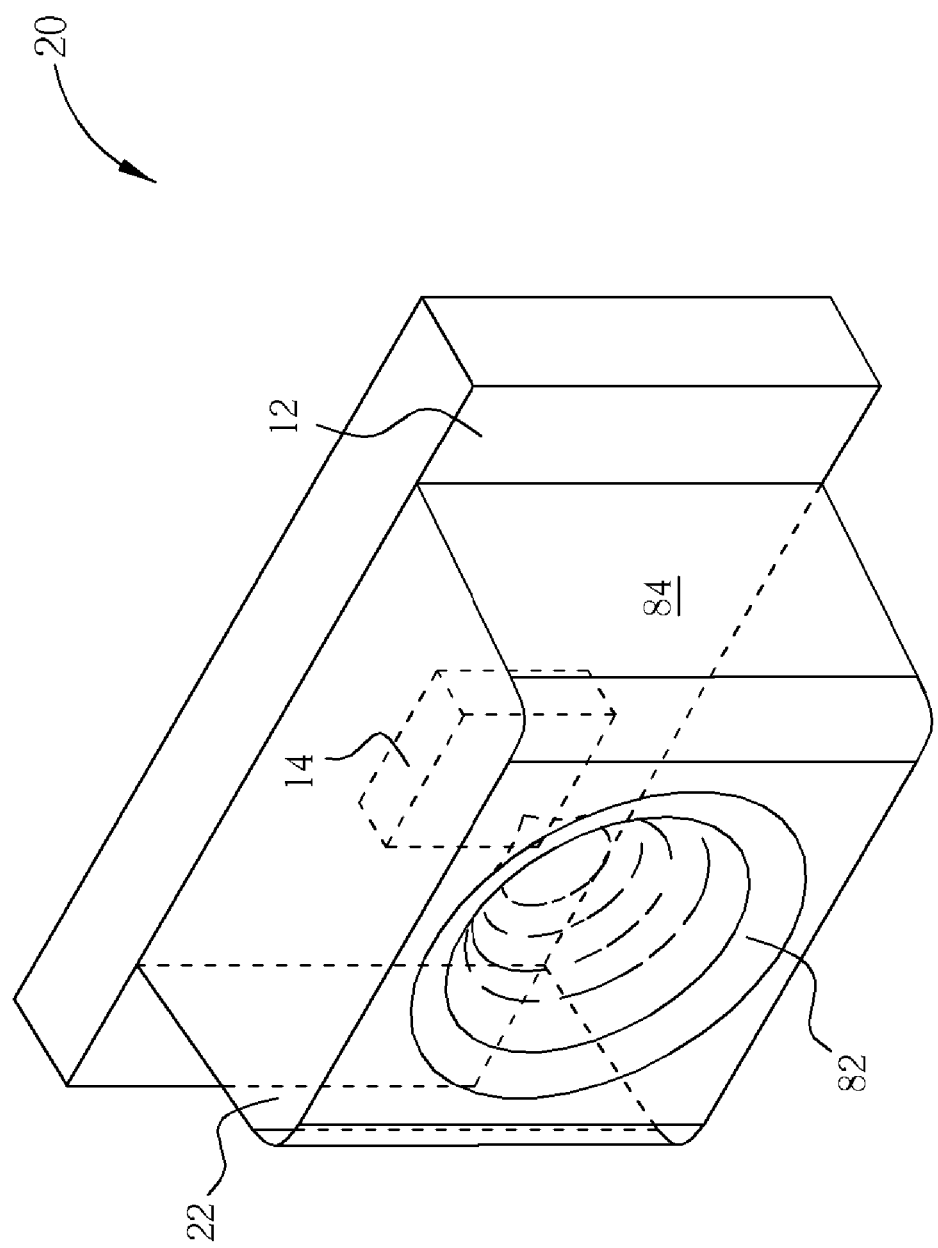
FIG. 6 is a schematic diagram of an LED component of a fourth embodiment according to the present invention.
Figure 7:
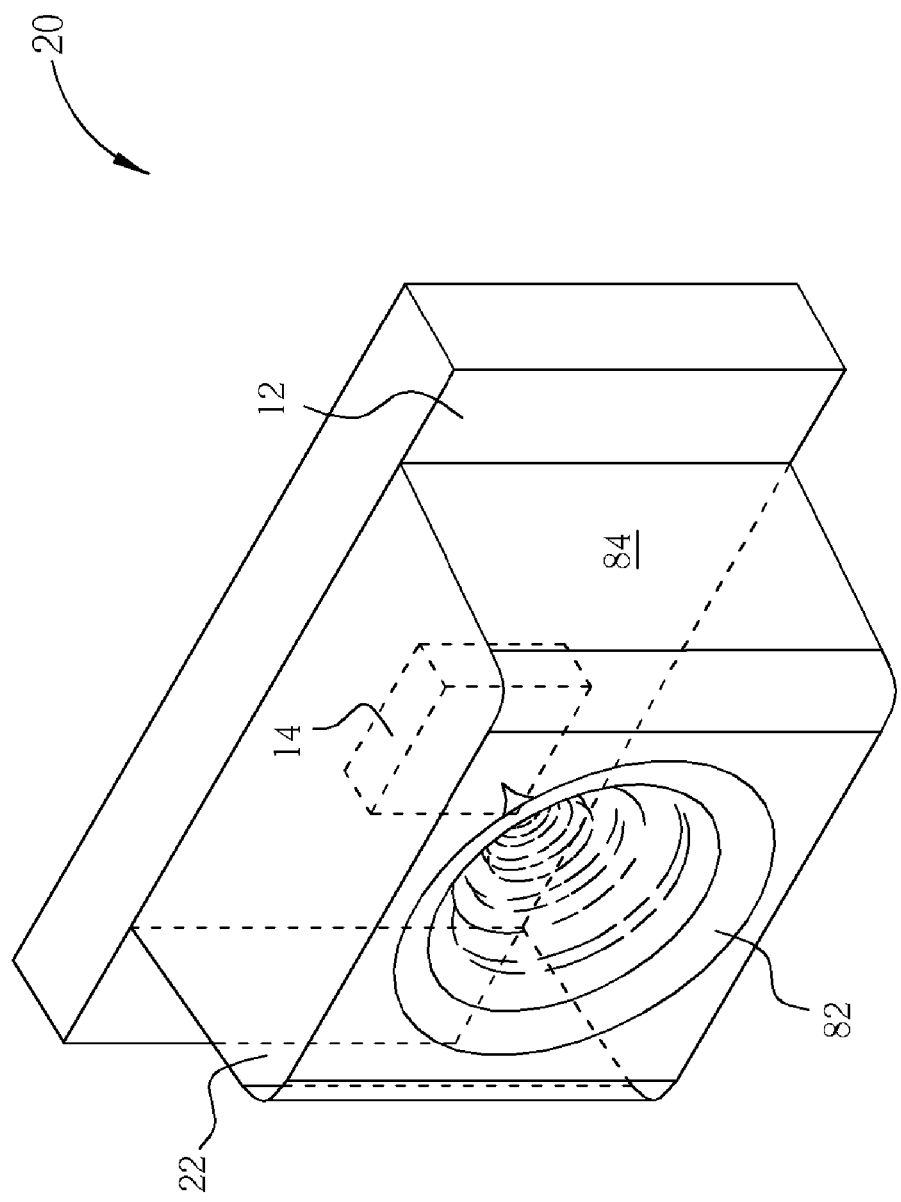
FIG. 7 is a schematic diagram of an LED component of a fifth embodiment according to the present invention.

In addition to the V-shaped planar and the V-shaped curved surfaces, the top reflecting surface 82 of the light direction-changing unit 22 can be in the shape of a conical indentation reflecting surface. The conical indentation reflecting surface of the light direction-changing unit 22 is a curved surface formed by a right triangle spinning around its right-angled edge, as shown in FIG. 6, or another curved surface formed by an arc line spinning around its tangent line, as shown in FIG. 7. Therefore, the light direction-changing unit 22 shown in FIG. 6 or FIG. 7 does not need the upright surfaces 32 any more.

According to the LED components 20 shown from FIG. 4 to FIG. 7, since the top reflection surface 82 of the light direction-changing unit 22 is not implemented exactly according to the standard, the LED component 20 further comprises a reflection layer 34 installed on the top reflection surface 82, as shown in FIG. 4, to increase the 3600 luminance distribution of light LLED traveling toward the direction in parallel to the circuit board 22. The reflection layer 34 reflects the remaining light not reflected by the top reflection surface 82 to travel toward the direction in parallel to the circuit board 12.

Of the second embodiment of the present invention, the reflection layer 34 is installed on the reflection surface through a pasting process, or the reflection layer 34 is a planted layer formed on the reflection surface 82.

Figure 8:
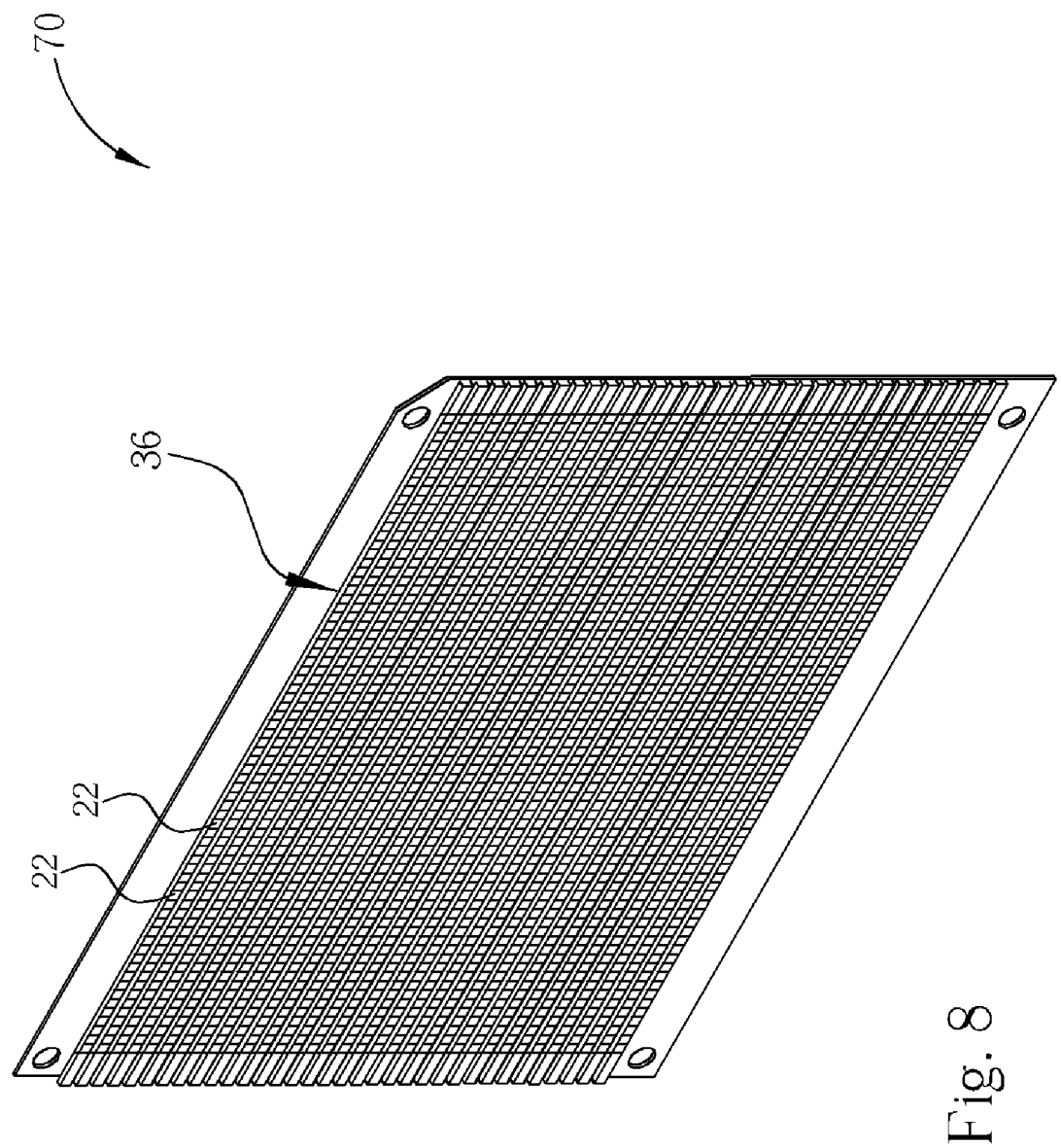
FIG. 8 and FIG. 9 are two schematic diagrams of an LED component array of a sixth embodiment according to the present invention.
Figure 9:
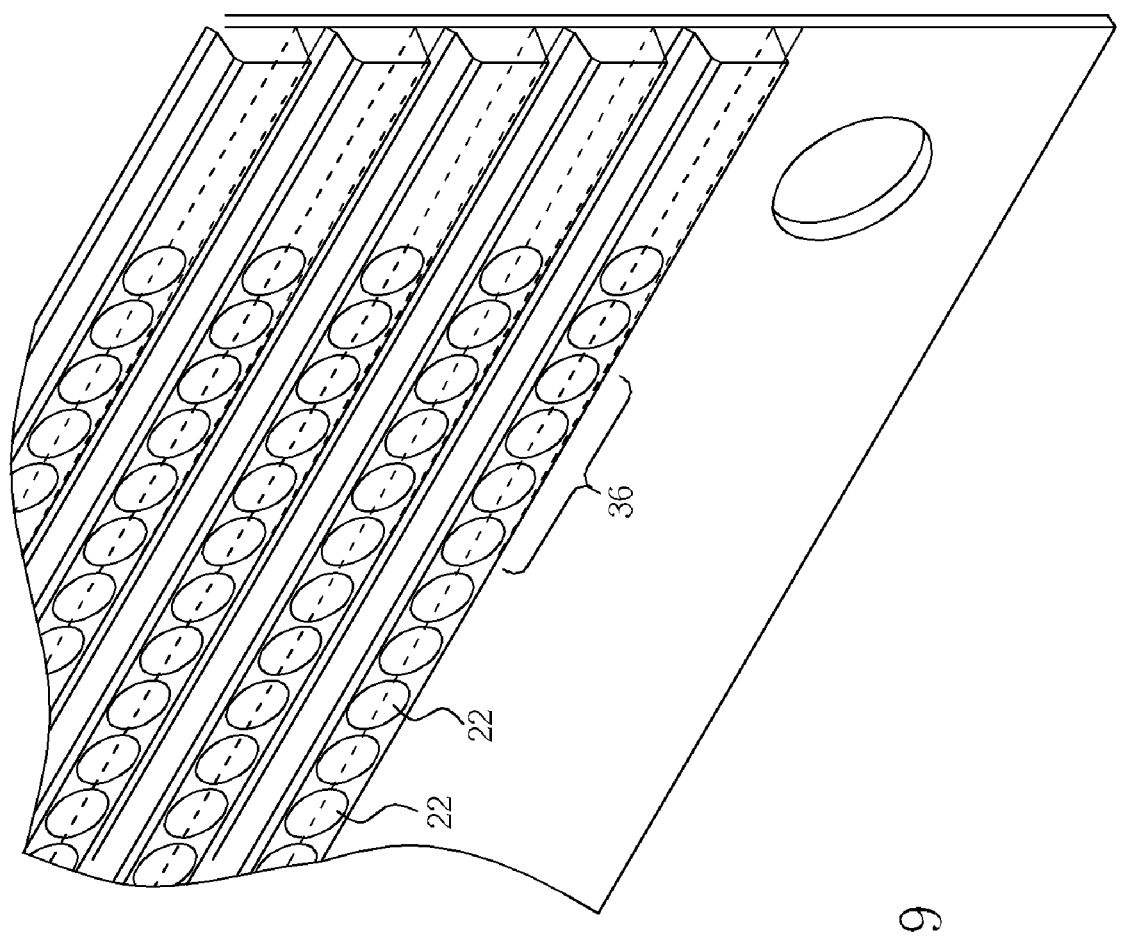

Of the above embodiments, the LED component 20 comprises a single LED chip, that is LED chip 14, and a single light direction-changing unit, that is the light direction-changing unit 22 corresponding to the single LED chip 14. However, an LED component of the present invention can comprise a plurality of LED chips and a plurality of light direction-changing units corresponding to the LED chips respectively, as shown in FIG. 8 and FIG. 9. In an LED component array 70 shown in FIG. 8 and FIG. 9, the light direction-changing units 22 are connected and form a light direction-changing module 36. Moreover, although the light LLED emitted by the LED chip 14 of the LED component 20 of the above embodiments travel primarily toward the direction perpendicular to the circuit board, and the light direction-changing unit 22, and the reflection layer 34 as well, reflects the light LLED to travel toward the parallel direction, light emitted by an LED chip of an LED component (or an LED component array) of the present invention does not have to travel toward the direction perpendicular to the circuit board 12, and, accordingly, a light direction-changing unit and a reflection layer do not have to reflect the light to travel to the direction in parallel to the circuit board 12, as long as the light direction-changing unit and the reflection layer are capable of reflecting the light emitted by the LED chip to travel toward the side reflection surface 84.

In contrast to the prior art, the LED component of the present invention includes a circuit board, an LED chip installed on the circuit board for emitting light, and a light direction-changing unit covering the LED chip for changing the light emitted by the LED chip to travel toward a direction in parallel to the circuit board. Therefore, the LED component can be applied to any side-viewing electronic device. A plurality of the light direction-changing units, which can be connected to each other, form a light direction-changing module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting diode (LED) component comprising:
    a circuit board;
    an LED chip installed on the circuit board for emitting light, the LED chip comprising a plurality of light-emitting points; and
    a light direction-changing unit for changing direction of the light emitted by the LED chip, the light direction-changing unit comprising:
        a covering surface for covering the LED chip; and
        a reflecting surface comprising a plurality of reflecting points, a smallest included angle of a plurality of included angles between a normal line of at least one of the reflecting points and a plurality of connection lines passing through the reflecting point and the light-emitting points being larger than $\sin^{-1}(1/n)$, where n is a refraction index of the light direction-changing unit, wherein the reflecting surface of the light direction-changing unit comprises a conical indentation reflecting surface that is a curved surface formed by an arc line spinning around its tangent line.

* * * * *

UNITED STATES PATENT AND TRADEMARK OFFICE
CERTIFICATE OF CORRECTION

| | |
|---|---|
| PATENT NO. | : 7,390,109 B2 |
| APPLICATION NO. | : 11/162466 |
| DATED | : June 24, 2008 |
| INVENTOR(S) | : Zhi-Feng Li et al. |

Page 1 of 1

It is certified that error appears in the above-identified patent and that said Letters Patent is hereby corrected as shown below:

On the title page, item (30), correct the application number of the Foreign Application Priority Data from "200510072958" to --200510072958.2--

Signed and Sealed this

Fourth Day of November, 2008

JON W. DUDAS
*Director of the United States Patent and Trademark Office*